United States Patent [19]
Cloetens et al.

[11] Patent Number: 5,337,335
[45] Date of Patent: Aug. 9, 1994

[54] PHASE LOCKED LOOP WITH FREQUENCY DEVIATION DETECTOR AND DECODER CIRCUIT COMPRISING SUCH A PHASE LOCKED LOOP

[75] Inventors: Henri Cloetens, Louvain, Belgium; Robertus W. C. Groen, Eindhoven, Netherlands

[73] Assignee: U.S. Philips Corporation, New York, N.Y.

[21] Appl. No.: 979,951

[22] Filed: Nov. 23, 1992

[30] Foreign Application Priority Data

Nov. 25, 1991 [EP] European Pat. Off. ......... 91203073.1

[51] Int. Cl.$^5$ ............................................. H03D 3/24
[52] U.S. Cl. ................................... 375/120; 307/510; 331/17; 331/32; 331/34
[58] Field of Search ............... 315/120, 81; 331/17, 331/32, 34, 40, 41, 1 A; 307/510

[56] References Cited

U.S. PATENT DOCUMENTS

| | | | |
|---|---|---|---|
| 4,568,887 | 2/1986 | Bierhoff | 331/1 R |
| 4,590,602 | 5/1986 | Wolaver | 375/120 |
| 4,757,279 | 7/1988 | Balzano | 375/120 |
| 4,803,705 | 2/1989 | Gillingham et al. | 331/34 |
| 5,214,677 | 5/1993 | Mori | 375/120 |

FOREIGN PATENT DOCUMENTS 0342736 11/1989 European Pat. Off. .

OTHER PUBLICATIONS

Philips Data Handbook 1990, vol. ICOLa, pp. 671–691.

*Primary Examiner*—Stephen Chin
*Assistant Examiner*—Amanda T. Le
*Attorney, Agent, or Firm*—Leroy Eason

[57] ABSTRACT

A phase locked loop includes a capture aid circuit to pull the frequency of the oscillator towards the bit frequency of a data signal $HF_{in}$ consisting of pulses of variable lengths, each length being an integral multiple of a single bit basic length unit. The capture aid circuit includes a pulse length detector for measuring and rounding pulse length to the nearest integral number of basic length units, and determining the difference ($\Delta RL$) between the measured and rounded length value (RL). For small frequency deviations the rounding error ($\Delta RL$) signal is used as a frequency deviation control signal for increasing or decreasing the oscillator frequency. For larger frequency deviations the minimum pulse length will be either more or less than a predetermined number of length units. That is detected by supplying the rounded pulse length signal (RL) signal to a pulse length decoder which determines the presence of pulses having a minimum length below the predetermined number of units or the absence of pulses having such minimum length. From signals indicative of those conditions further control signals are derived in a frequency deviation detector, which further control signals adjust the oscillator frequency so as to bring the frequency deviation within the range in which the rounding error ($\Delta RL$) signal can be used to precisely adjust the oscillator frequency to the bit frequency of the data signal.

11 Claims, 3 Drawing Sheets

PHASE LOCKED LOOP WITH FREQUENCY DEVIATION DETECTOR AND DECODER CIRCUIT COMPRISING SUCH A PHASE LOCKED LOOP

BACKGROUND OF THE INVENTION

The invention relates to a phase locked loop ("PLL") comprising
- a phase comparator having an oscillator input for receiving an oscillator signal and a data input for receiving an input signal comprising pulses,
- a loopfilter circuit having an input coupled to an output of said phase comparator, and
- an oscillator with a control input coupled to an output of said loopfilter circuit and an output coupled to the oscillator input of the phase comparator,
the phase locked loop further comprising
- a frequency deviation detector for detecting a difference in frequency between said data signal and said oscillator signal, the frequency deviation detector having an output coupled to an input of said loop filter circuit.

Such a PLL is used for recovery of a clock signal from a digital data signal in which pulses have a length that is an integral multiple of a basic length unit. For example, the data signal from a digital optical read-out apparatus such as a CD-player or other digital recording apparatus. The clock signal is used to derive the length of each pulse as a number of basic length units. Therefore, the oscillator should operate at a frequency such that the oscillator period is locked to the basic length unit as much as possible. Such a PLL can also be used when all the pulses have the same length. The invention also relates to a decoder circuit for a digital recording system comprising such a PLL.

A PLL and a decoder circuit according to the introductory paragraph is known from Philips Data Handbook 1990, Vol IC01a, pages 671-691. In this document a decoder circuit (SAA7210) is described for a digital audio circuit. The circuit includes a PLL with an analog voltage controlled oscillator. When the PLL-system is not phase-locked a capture-aid circuit comprising a pair of frequency deviation detectors generates a signal to pull the oscillator frequency into the capture range of the PLL. In the capture-aid circuit a first frequency detector compares the frequency deviation of the oscillator with that of a crystal clock, providing coarse frequency deviation control. The second frequency detector uses data run length violations to provide fine frequency control. A run length violation occurs when a pulse in the data signal is determined to have a length that does not occur in the signal; the standardized compact disc format EFM-coding (Eight to Fourteen Modulation) pulses have a run length of at least three and at most eleven periods of the basic length unit. Once the PLL is locked a lock detector disables the outputs of the frequency deviation detectors to enable the PLL to operate without being disturbed by spurious signals from the frequency deviation detectors.

This known circuit has as a disadvantage that pulses of shortest or longest possible length may be relatively rare in certain types of coding or data sequences. In EFM coding only 1% of the pulses has the maximum length of eleven basic units. In general the known circuit is sensitive for noise that disturbs the longest length pulses. A consequence of this is that lock-in is poor (slow) with certain types of coding or data sequences, and that the PLL frequency may drift away during a fast jump. On a disc-shaped record carrier a fast jump occurs when the read-out unit makes a fast movement in the radial direction, crossing a number of the circular information tracks. During fast (radial) jump, the PLL will read data only a short time from a certain track. After this time, it will skip to the next track. The crossing of the tracks disturbs the longest pulses in such a way that the capture aid circuit will not pull the PLL frequency to the data frequency any more. Pulses of longest length may not be properly recognized and false detections are possible as well.

SUMMARY OF THE INVENTION

It is, inter alia, an object of the invention to provide a phase locked loop with a capture-aid circuit that gives fast, reliable lock-in behaviour under all circumstances even on coding sequences with many or few pulses of maximum length, even during fast jump. It is also an objective to realize a PLL capture aid circuit that does not take long run-length information into account.

To this end, a PLL according to the invention is characterized in that the capture aid circuit comprises a pulse length detector for determining the direction for rounding the length of a pulse in said input signal to an integer number of periods of the oscillator signal, said integer number of periods having a total length closest to said length of said pulse. By measuring the length of a pulse in periods of the oscillator signal and detecting if the nearest integer number of periods is smaller or larger than the measured length, each pulse contributes to the frequency deviation signal provided the frequency deviation is relatively modest. In accordance with the invention the pulse length detector may actually calculate the sign of the difference of the pulse length and its nearest integer-number of periods. An alternative, in which the tractional amount is detected by which the length of the pulse exceeds the largest integer number of oscillator periods smaller than the pulse length may be measured. This fractional amount is directly related to the sign and the latter can be derived by determining if said fractional amount is above or below one half. Various other schemes to determine numbers that are directly related to the sign of the rounding operation can be used within the scope of the present invention.

The capture range of a capture aid circuit as defined above is limited by the length of the longer pulses. When the longest pulse has a length of eleven units the capture range is about 5%. It is somewhat larger if the relative occurrence of the longer pulses is low. For example, in an audio signal as recorded on a compact disc in EFM-coding the capture range is about 6%.

To obtain a larger capture range, an embodiment of a PLL in accordance with the invention is characterized in that it comprises means for inhibiting the output of the pulse length detector when the integer number of periods with a total length nearest to the length of a pulse deviates from a predetermined value. In particular, if the predetermined value is small and pulses with that length occur frequently, the capture range can be increased significantly. In EFM-coded signals the obvious choice for the predetermined number of periods is 3. A symbol length decoder detects the presence of pulses having a length after rounding equal to 3. Ben such a pulse is detected, the frequency deviation detector output will be activated. The range obtained is about 16% ($\approx 0.5/3$).

To obtain an even larger capture range an embodiment of a PLL in accordance with the invention is characterized in that the input signal comprises pulses of variable length, and capture aid circuit the comprises a pulse length detector for detecting the length of the pulse in the input signal that is shortest in the number of N consecutive pulse units. The pulse length detector not only detects the presence of the pulse with shortest possible length after rounding, but also run length violations, i.e. pulse lengths that should not occur, and in addition it detects the absence of pulse lengths that should occur. This embodiment is further characterized in that the capture aid circuit comprises a pulse length decoder for generating at its output an output signal having a first value if the shortest detected pulse length is below a predetermined lowest length and for generating a second value if the shortest detected pulse length is above the predetermined lowest length. If a pulse length shorter than the shortest pulse length that should occur is detected, the frequency deviation detector will produce a signal to increase the PLL frequency. When a sequence of pulses is tested, the sequence having a length sufficiently long so that a pulse with shortest length has a high probability to occur, and no such pulse is detected, the frequency deviation detector will generate a signal to decrease the oscillator frequency. The advantage of this capture aid is its very large capture range, actually extending to the full range of the PLL. An additional advantage of this embodiment is that no external clock is necessary to increase the capture range of the PLL.

Alternatively, the presence of run length violations for the longest occurring pulses or the absence thereof can be used for generating the signals to increase or decrease the PLL frequency, as well.

To avoid disturbance of the PLL by spurious signals from the pulse length decoder and/or the pulse length detector, the PLL comprises a frequency lock detector for switching on and off the frequency deviation detector output signals. The the lock detector is arranged to measure the distance between characteristic pulse sequences at predetermined distances in the input signal during periods of the oscillator signal. It is remarked that it is known per se, from the above mentioned Philips Data Handbook 1990, Vol IC01a, pages 671–691, to use a lock detector to inhibit the output of the capture-aid circuit when the PLL is locked. However, the known lock detector detects only the presence or absence of a synchronization pulse after a predetermined distance and does not measure the distance between synchronization sequences in the flow of data. The embodiment of the PLL in accordance with the invention may further be characterized in that the lock detector is connected for deactivating the frequency deviation output signals when the measured distance between said characteristic pulse sequences equals a nominal distance.

A further embodiment of the PLL in accordance with the invention, comprising both a pulse length decoder and a pulse length detector, is characterized in that the lock detector has a control output at which it produces a control signal that is in a first state when the measured distance between said characteristic pulse sequences fall outside a predetermined window and that is in a second state when said measured distance falls inside said window, the control output being coupled to said pulse length detector and pulse length decoder for selectively activating one of them depending whether the control signal is in a first or second state. By measuring the distance between the synchronizing pulse sequences and switching between the two types of frequency deviation signals, the capture-aid circuit output signal is optimized to the frequency deviation.

Since the PLL according to the invention is completely digital it is well suited to be integrated into an integrated circuit.

The invention relates also to a decoder circuit for a digital recording system, wherein an information signal is represented by a sequence of data pulses with variable length, each data pulse having a length which is an integer multiple of a basic length unit, the decoder circuit comprising a PLL of a type described above for generating a clock signal from the dam pulses, the clock signal having a period related to said basic length unit. Such a decoder circuit can be fully digital, in particular comprising a digital oscillator, and therefore can be integrated simply on one chip together with digital circuits for information processing , such as error correction circuits.

BRIEF DESCRIPTION OF THE DRAWINGS

These, and other more detailed aspects of the invention will now be elucidated by way of example with reference to the accompanying drawings, wherein The drawings show in FIG. 1 diagrammatically a PLL with a phase comparator, a loopfilter, a digital oscillator, a data-slicer and a capture aid circuit;

FIG. 5 diagrammatically an embodiment of a synchronization detector; and in

DESCRIPTION OF THE PREFERRED EMBODIMENTS

Figure 1:
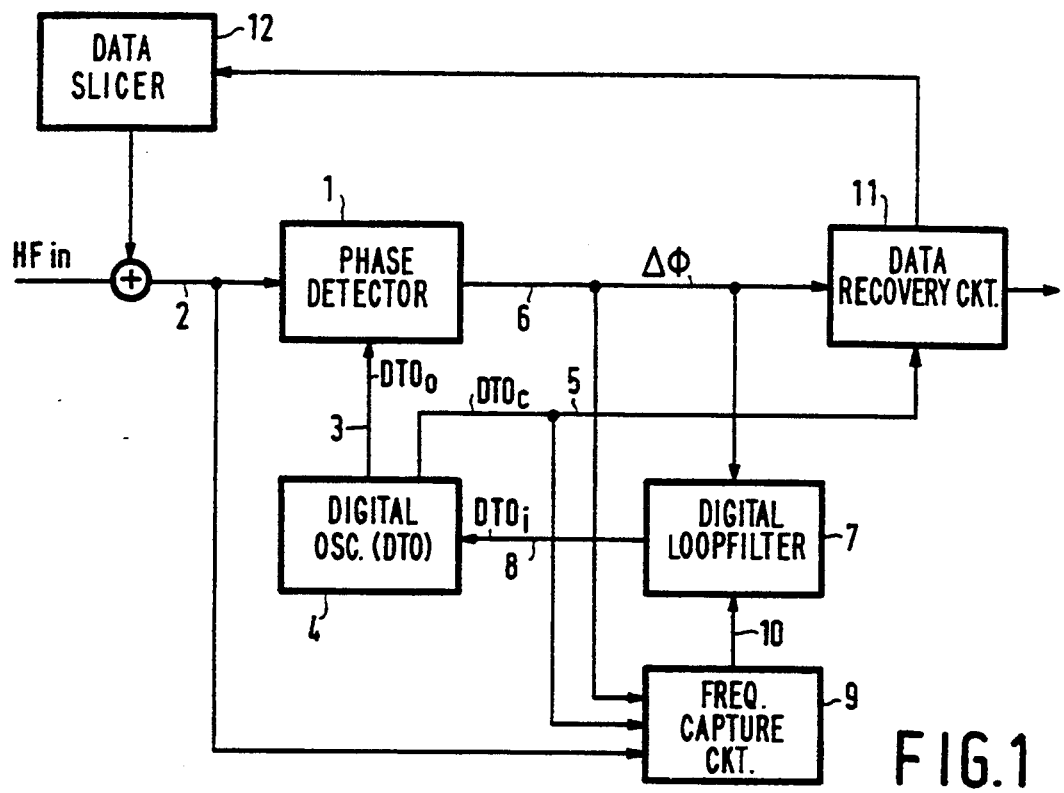

In FIG. 1 a circuit of a PLL for data recovery in a signal from a CD-player is diagrammatically shown. The circuit comprises a phase detector 1, with a connection 2 for a data input signal $HF_{in}$ and a connection 3 for an input oscillator signal. The oscillator signal is generated in a digital oscillator 4, hereinafter referred to as a discrete time oscillator or DTO, the frequency of the oscillator signal being determined by the value of a DTO input signal $DTO_i$. The DTO 4, for example, generates two output signals, a sampled sawtooth waveform $DTO_o$ applied, via connection 3, to the phase detector 1, and a pulsed output signal $DTO_c$, for use as the clock signal in the data recovery circuitry 11. The pulses of $DTO_c$ correspond to overflows, the falling edges, in the sawtooth waveform, the value of the $DTO_o$ signal corresponds to the value of the sawtooth waveform at the last sampling moment. The phase detector 1 generates the expected value of a sawtooth waveform with the DTO frequency at the $HF_{in}$ transition time which corresponds to a phase error signal $\Delta\phi$. This signal is transmitted via an output connection 6 to an entrance of a digital loopfilter 7, to the data recovery circuit 11 and to the capture aid circuit 9. The loopfilter 7 closes the PLL control loop and will regulate the phase error to zero by adjusting the value of the DTO input signal $DTO_i$. An example of a fully digital PLL, is described in EP-A 0 342 736 to which application is referred for the operation of a full circuit.

In addition to the functions mentioned before, FIG. 1 shows two further circuits. A capture aid 9 and a data slicer 12. The data slicer 12 provides a change in the d.c.-level of the input data signal $HF_{in}$ to compensate for any offset of the average level occurring in the reading of the signal. The input of the data slicer 12 is, for example, the average length of positive and negative pulses or the average value of the compensated data signal. An input can be derived from various points in the circuit, not only from the data recovery circuitry 11, as shown.

The capture aid circuit 9 is necessary to pull the DTO 4 into the proper frequency range. The inputs to of the capture aid circuit 9 are the data input signal $HF_{in}$, the oscillator pulse signal $DTO_c$ and the phase error signal $\Delta\phi$. When there is a deviation between the $HF_{in}$ signal and the oscillator signal, the output of the capture aid circuit 9 is input to the loopfilter 7, via a connection 10, causing an increase or decrease of the oscillator frequency.

Figure 2:
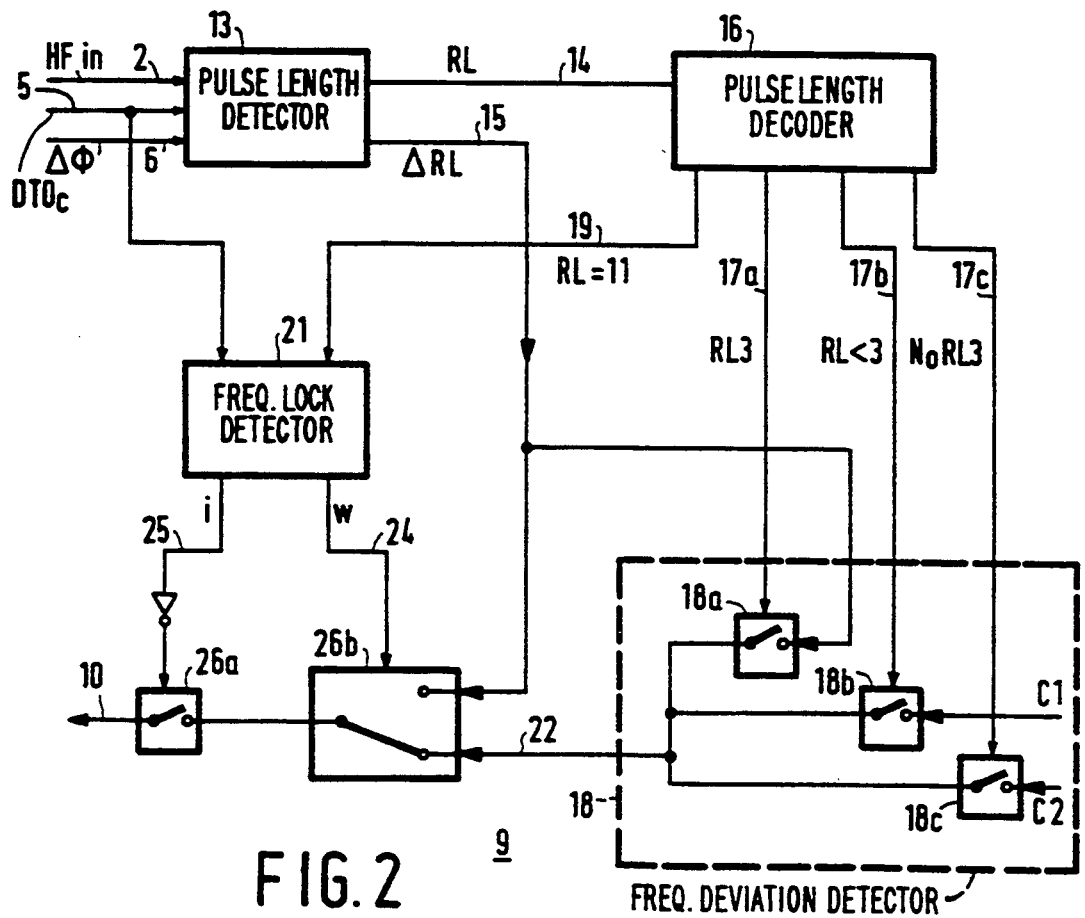
FIG. 2 an embodiment of a capture aid circuit shown in more detail.

In FIG. 2 an embodiment of a capture aid circuit 9 in accordance with the invention is given in further detail. The description is based upon a circuit for handling of EFM-coded data, a coding presently used for the optical digital audio disc known as compact disc (CD). Features of such data used for implementation of the shown circuit comprise the facts that pulses have pulse lengths in the range of three to eleven, inclusive, expressed in basic length units; that pulses of short length are much more common than pulses of long length; and that synchronization sequences occur in the data signal consisting of two consecutive pulses of length eleven, which sequences are separated by a distance of 588 basic length units. A circuit for handling a binary data signal with features different from the features mentioned can be obtained by making the appropriate changes to the circuit.

FIG. 2 shows a data input signal $HF_{in}$, an oscillator pulse signal $DTO_c$ and a phase detector output signal $\Delta\phi$ which are presented, via the connections 2, 5 and 6, to a pulse length detector circuit 13. Such circuit generates an output signal indicating the length RL of a pulse rounded to the nearest integer number of oscillator periods, and an output signal indicating the difference $\Delta$RL between the actual pulse length and the rounded value. The rounded pulse length RL is transmitted to a pulse length decoder 16, via connection 14. The difference signal $\Delta$RL is input, via a connection 15, to a switch 26b, which may select it as frequency deviation signal, and to a frequency deviation detector 18 comprising switches 18a, 18b and 18c. This detector 18 generates another frequency deviation signal at its output connection 22, in response to input signals which are the output signals from pulse length detector 16.

The pulse length decoder 16 has four outputs. On a first output 17a a signal is generated when a pulse with length 3 (RL3) is detected. A signal appearing at a second output 17b indicates the occurrence of a pulse with rounded length less than 3 (RL<3) and a third output 17c for indicating the absence of pulses with rounded length 3 (NoRL3). A fourth output 19 is used to indicate the presence of pulses with length eleven for use in a SYNC-symbol detector 21.

The output signals RL3, RL<3 and NoRL3 activate switches 18a, 18b and 18c, respectively, in the frequency deviation detector 18. The presence of a pulse with rounded length less than 3 or the absence of pulses with length 3 corresponds to an oscillator frequency that is too low or too high, respectively. These signals are used in frequency deviation detector 18 to generate a control signal to change the oscillator frequency. The generation of the control signal is done by switches 18b and 18c, respectively. Switch 18b, activated if a signal occurs indicating a pulse with rounded pulse length less than 3, will inject a negative control signal $C_1$, switch 18c, activated by a signal indicating the absence of pulses with pulse length 3, will inject a positive control signal $C_2$. Furthermore, frequency deviation detector 18 will react on the presence of pulses with rounded length 3 at connection 17a. For these pulses a frequency deviation error signal will be injected to output connection 22 via switch 18a. In this case the frequency deviation signal is taken equal to the rounded pulse length difference signal $\Delta$RL. If the frequency deviation between the DTO frequency and the connection 15 frequency of the data signal $HF_{in}$ is low (16%), the frequency deviation signal for pulses of length 3 will indicate whether the oscillator frequency is above or below the data frequency. If the frequency difference is larger than 16%, corrective action will be taken by switches 18b and 18c, coupled to the signals at outputs 17b and 17c. Hence frequency deviation detector 18 will have a capture range equal to the full DTO range.

With frequency deviation detector 18 alone, it is difficult to bring the PLL frequency close enough to the lock-point, i.e. the point were the DTO frequency is equal to the data frequency. This is due to the fact that the run length difference signal $\Delta$RL can have a systematic offset for all pulses of length 3. The result of this will be that the frequency deviation detector 18 will push the DTO to a frequency that in a realize embodiment may be up to 4% off the control lock-in frequency.

To eliminate this problem, a switch 26b has been introduced. If the PLL frequency is close enough to the data frequency, the run length difference signal for all pulses will be used as frequency difference signal. Since the signal will be used for all pulses, not only the pulses with length 3, any offset of the length 3 pulses will be compensated for by offsets on the other pulses. Provided the frequency deviation between DTO and data frequency is limited to less than 6%, the sign of this signal indicates whether the oscillator frequency is above or below the data signal frequency.

As will be described below, reliable lock-in will be provided by the appropriate selection of the error signal via switch 26b. A connection 19 is attached to a fourth output of pulse length decoder 16 and the input of a synchronization detector 21. At an other input the synchronization detector 21 receives a DTO output signal, for example $DTO_c$ via connection 5. In the EFM-coded data signal the presence of two consecutive pulses with a length of eleven basic length units indicates a SYNC symbol. SYNC symbols are spaced by 588 basic length units. In the synchronization detector 21 the SYNC symbols are detected and the distance between SYNC symbols measured in oscillator periods. When this distance is exactly 588 oscillator periods the deviation between the oscillator frequency and the dam frequency is very small, the PLL is considered to be in lock. A signal indicating this situation is output from the synchronization detector via connection 25 and is used to inhibit the output signal of the frequency deviation detector 18 to reach the loopfilter. To avoid spurious and unnecessary effects, the signal may be maintained also when no SYNC symbols occur in the data for a predetermined time. When the SYNC symbols are not spaced 588 oscillator periods, the PLL is not in lock and an output of the frequency deviation detector is passed to the loopfilter. When the number of oscillator periods between two SYNC symbols is outside a window around 588 of approximately 6%, for example, less than 560 or more than 626, the output signal of the frequency deviation detector 18 is used to pull the PLL into range. As a large deviation makes it unlikely to detect SYNC symbols, a prolonged absence of these symbols is causing deviation detector 18 to be switched on as well.

When the number of oscillator periods between two SYNC symbol is within said window, the output signal $\Delta RL$ of the pulse length detector circuit 13 for all pulses will be used as frequency difference signal. When this is not the case, the output of frequency deviation detector 18 will be used as input to the loopfilter in order to pull the DTO toward the desired frequency. The selection of the proper frequency deviation signal is done by a switch 26b to which the output signals of the synchronization detector 21 and the frequency deviation detector 18 are applied and to which output a connection 10 is attached to transmit the selected signal to the loop filter 7.

Figure 3:
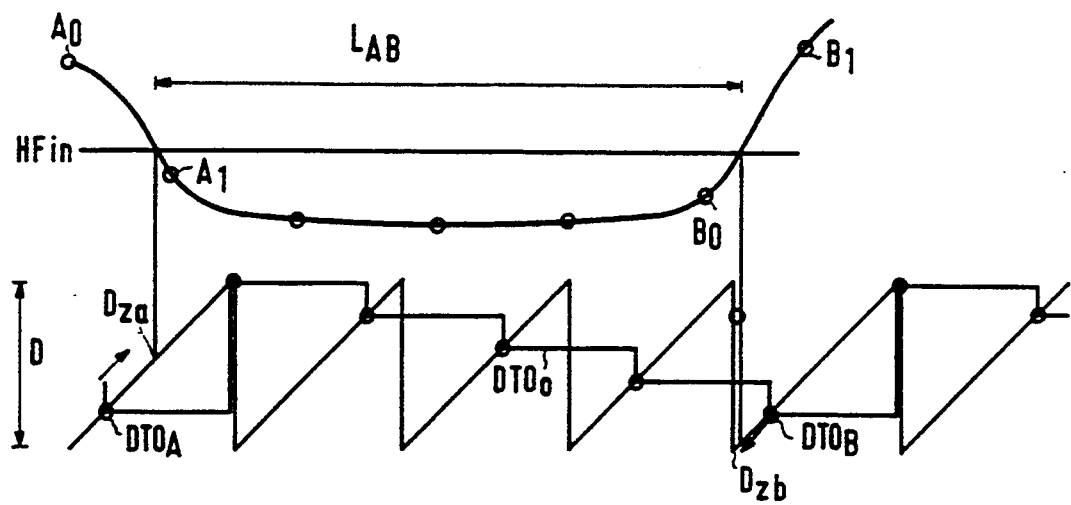
FIG. 3 an illustration of the measurement of a pulse length.

In FIG. 3 an example is presented of the calculation of the pulse length in a pulse length measuring circuit 13. In this Figure the lower graph represents 2 signals: the staircase signal represents the shape of the $DTO_o$ signal, while the sawtooth signal represents the (fictitious) output signal of a voltage controlled oscillator running at the same frequency as the DTO. This last signal has been added to explain the behaviour of the phase detector 1. The fictitious sawtooth signal is a linear rising signal with a drop once every period, when a so-called overflow occurs. These overflows coincide with pulses on the other DTO-output signal $DTO_c$. The upper graph represents the shape of one, negative, pulse of the $HF_{in}$ data signal. The $HF_{in}$ and sawtooth signals are sampled with a frequency of about twice the oscillator frequency, as indicated by the circles on the graphs. The sample points of the $HF_{in}$ signal are located halfway in between the sample points of the sawtooth signal, the steps in the $DTO_o$ signal. As mentioned in more detail, in the before mentioned EP-A 0 342 736, first the values $D_{za}$ and $D_{zb}$ of the $DTO_e$ signal at the times of the zero crossing of the $HF_{in}$ signal are calculated by linear interpolation between the sampling points $A_0$ and $A_1$ and between $B_0$ and $B_1$, respectively. $A_0$ and $A_1$, and $B_0$ and $B_1$ have opposite signs and are the sample points just before and just after the zero crossings of the data signal $HF_{in}$. The calculation starts from the values $DTO_A$ and $DTO_B$ of the $DTO_o$ signal, sampled halfway between $A_0$ and $A_1$ and between $B_0$ and $B_1$, respectively. The length $L_{AB}$ of the pulse from A to B is given in oscillator periods as: $L_{AB}=NO+(-D_{za}-D_{zb})/D$, wherein NO is the number of overflows and D is the amplitude of the sawtooth signal. This amplitude may be normalised to 1. The formula is correct even if an overflow occurs during the calculation of $D_{za}$ or $D_{zb}$. From this length $L_{AB}$ a rounded pulse length RL and a rounding error $\Delta RL$ is derived. The rounded length does not depend on the phase lock between the DTO and the data input signal.

Figure 4:
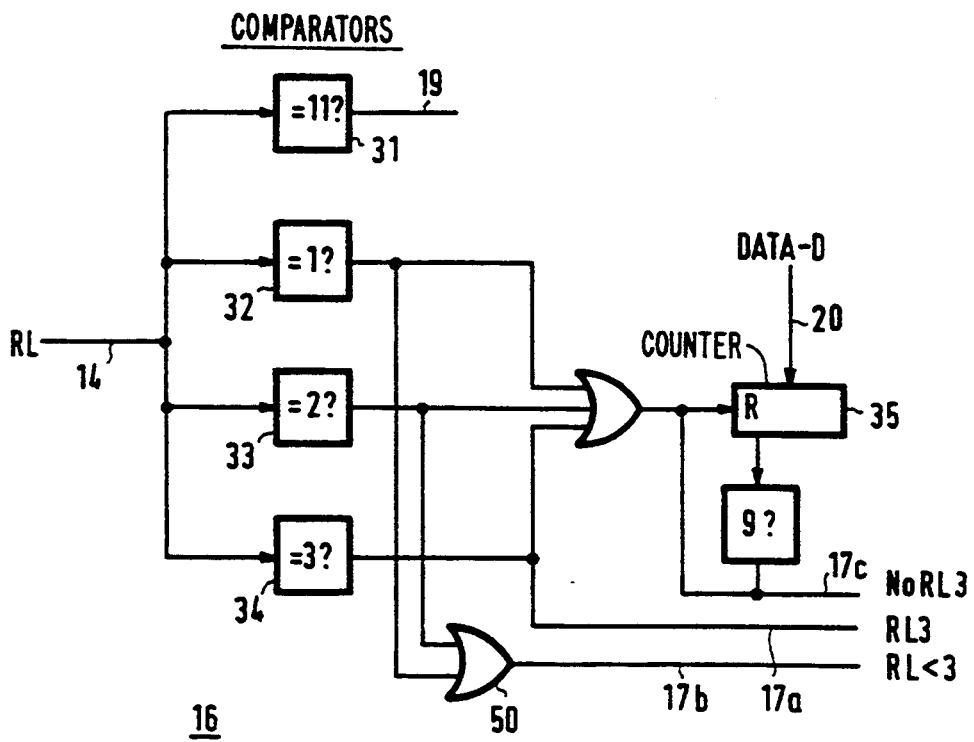
FIG. 4 diagrammatically a pulse length decoder circuit for the detection of a pulse with too short a length, or the absence of short pulses.

In FIG. 4 a possible configuration of a pulse length decoder circuit 16 is shown. The length of a rounded symbol RL is presented via connection 14 to four comparators 31, 32, 33 and 34. In comparator 31 it is checked if the pulse has a rounded length of eleven, if so, a signal is presented via connection 19 to the synchronization detector. In the comparators 32, 33 or 34 a short pulse length, i.e. of length 1, 2 or 3 is detected. The output signals of the comparators 32, 33 and 34 are combined to a short pulse signal, for example in an OR-gate, and presented to a reset input of a counter 35. The counter 35 counts the pulses in the data signal as presented by a signal DATA_D via connection 20. Signal DATA$_{13}$ D is, for example, derived from the pulse length detector circuit 13 and is at a logic high level each time the data signal changes sign. When the counter 35 reaches a predetermined number, for example 9, without being reset by a short pulse signal, a signal is generated indicating the absence of short signals. Both the short pulse signals as the absence of a short pulse signal are presented via a connection 17a, 17b and 17c to a frequency deviation detector. The outputs 17a, 17b and 17c indicating a pulse with length 3, a pulse with length less than 3 and the absence of the pulses with length 3 respectively. In EFM-coded data for audio disc about one in three pulses is three basic length units long. So the chance for not having a short pulse in 9 consecutive pulses is very low. Experience has shown that 9 pulses give good results, better than a number of pulses significantly larger or smaller.

Figure 5:
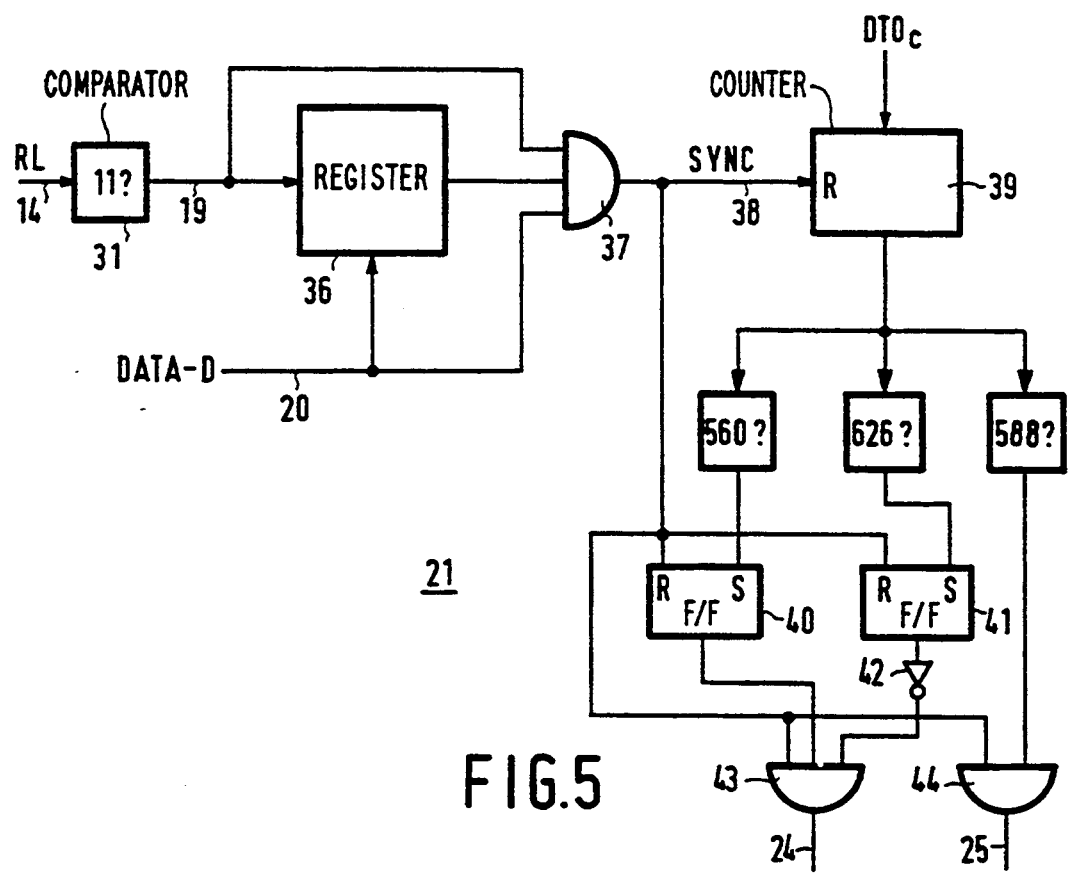

In FIG. 5 a synchronization detector 21 is indicated diagrammatically. When a pulse with length 11 is detected in comparator 31, a signal is passed on line 19 to the data entrance of a register 36, for example a D-type flip-flop, and to an entrance of an AND-gate 37. The register 36 is clocked by the DATA_D signal on line 20. The pulse is delayed by the register till the occurrence of the next pulse is indicated by the DATA_D signal. The stored pulse is outputted towards a second input of the AND-gate 37. To ensure synchronization with the occurrence of a pulse, also the DATA_D signal is input to the AND-gate. Consequently, the output of the AND-gate goes high when two consecutive pulses of length 11, a SYNC symbol, are present in the data. The SYNC signal is presented via connection 38 to the Reset input of a counter 39. The data input of this counter is connected to an output of the DTO.

The counter 39 counts the number of oscillator periods after the occurrence of a SYNC symbol. As soon as the counter reaches 560, the lower edge of a window interval, a first flip-flop 40 is set. A second flip-flop 41 is not set until the counter reaches 626, the upper edge of the interval. The output of the second flip-flop is inverted in invertor 42. The output of the first flip-flop 40, and the inverted output of the second flip-flop are input to an AND-gate 43. To a third input of this AND-gate 43 the SYNC signal is supplied via connection 38. Consequently, AND-gate 43 produces a logic high signal when a SYNC symbol occurs in between 560 and 626 oscillator periods from the earlier SYNC symbol. A second AND-gate 44, generates an output signal when a SYNC symbol coincides with the counter 39 having reached 588 oscillator periods. To avoid spurious signals, due to temporarily absence of SYNC sequences in the data signal, for example during a drop-out when no data can be read because of a local disturbance on the record carrier, the output signals of the AND-gates 43 and 44 can be maintained for a while when no SYNC signals occur.

Figure 6:
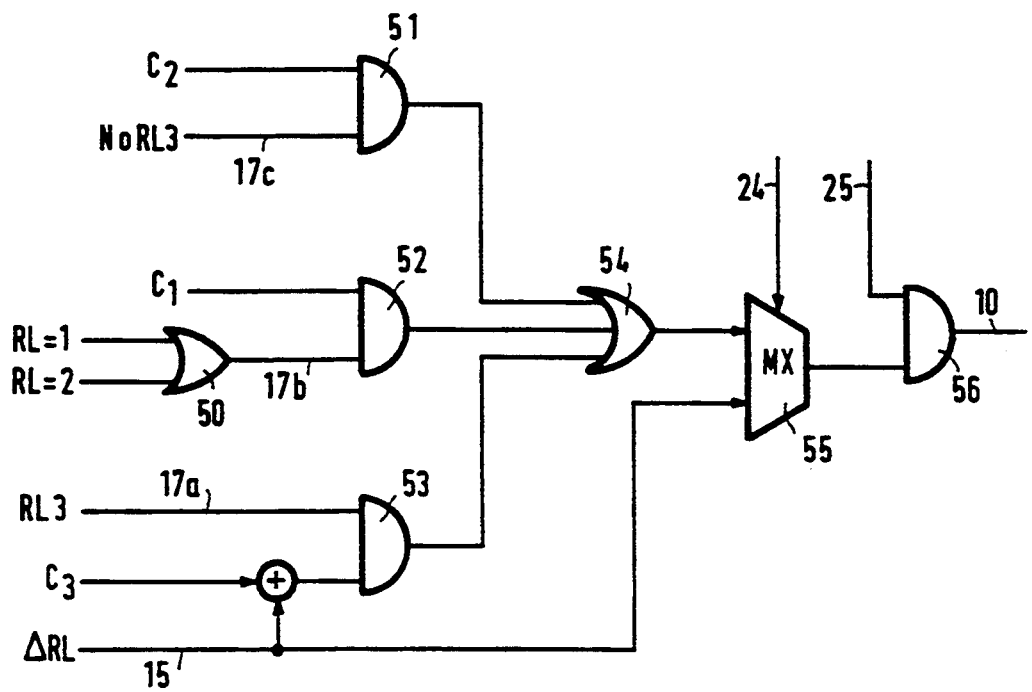
FIG. 6 an embodiment of a frequency deviation detector.

In FIG. 6, an example of a frequency deviation detector is shown. A first portion handles the presence or absence of short pulses. The presence of pulses of length 1 or 2 will lead in the frequency deviation detector to a signal to increase the oscillator (DTO) frequency. Such a pulse is, via OR-gate 50 and connection 17b, transmitted to an AND-gate 52. The other input of this AND-gate 52 is provided with a signal $C_1$ having a level that causes the oscillator frequency to be increased. The signal $C_1$ is transmitted to a combination circuit 54. When no short pulses occur a signal is present on line 17c. This signal enables a signal $C_2$ to reach the combination circuit 54, via the AND-gate 51. Signal $C_2$ will lead to a decrease of the oscillator frequency. When a pulse of length 3 is detected and indicated to the frequency deviation detector via a signal on line 17a, a value corresponding to the deviation $\Delta RL$, available via connection 15, will be transmitted to the combination circuit 54 via AND-gate 53. This signal may be modified by a constant value $C_3$ to correct for a possible systematic error in pulses of this length. The output of combination circuit 54, i.e. one of the signals $C_1$, $C_2$ or (modified with $C_3$) $\Delta RL$ is input to a multiplexer 55. The other input of multiplexer 55 is directly connected to a signal derived from the rounding error $\Delta RL$, whereby no selection on pulse length is made. The output of the multiplexer is selected by a signal on the connection 24. This latter signal is an output signal of the synchronization detector and indicates whether the distance between the synchronization sequences in the input data occur within a predetermined window, measured in oscillator periods. Within this window the rounding error signal $\Delta RL$ for all pulses is used, outside this window, the rounding error of pulses with length 3 or the presence or absence of short pulses.

Finally, the output signal of the multiplexer is input to another selection circuit 56, for example an AND-gate, which transmits this input signal to its output connection 10 only when the signal on the other input allows such. This other input is connected, via line 25, to the output of the synchronization detector indication that the distance between synchronization sequences is 588 oscillator periods, i.e. the deviation between oscillator frequency and data frequency is very small. Circuit 56 is arranged such that it inhibits the frequency deviation signal to reach the loopfilter.

We claim:

1. A phase lock loop for locking a local digital oscillator in said loop to a clock frequency determined by a received data signal consisting of pulses of variable lengths, the length of each pulse being an integral multiple of a basic length unit corresponding to said clock frequency; said phase lock loop comprising:
   a phase detector having an oscillator input for receiving the digital oscillator signal and a data input for receiving the data signal, said phase detector producing at an output thereof a phase difference signal ($\Delta\phi$) indicative of a phase difference between the pulses in said oscillator signal and the pulses in said data signal;
   a digital loopfilter for receiving said phase difference signal ($\Delta\phi$) and having an output coupled to a control input of said oscillator;
   a frequency capture circuit having a first input coupled to said oscillator to receive said oscillator signal, a second input coupled to the output of said phase detector to receive said phase difference signal ($\Delta\phi$), and a third input coupled to the data input of said phase detector to receive said data signal; said frequency capture circuit detecting a difference in frequency between said data signal and said oscillator signal and to produce a frequency deviation signal at an output thereof, said output being coupled to a control input of said loopfilter to supply said frequency deviation signal thereto, said frequency deviation signal causing said loopfilter to produce at its output a frequency control signal for controlling the frequency of said oscillator; and
   a pulse length detector circuit comprised in said frequency capture circuit for measuring the length of a pulse in said data signal and rounding it to the nearest integral number of periods of said oscillator signal, said pulse length detector circuit producing a pulse length signal (RL) indicative of the rounded length and a length deviation signal ($\Delta RL$) indicative of deviation between said rounded length and the measured length;
   said frequency capture circuit deriving said frequency deviation signal on the basis of said rounded length signal (RL) and said length deviation signal ($\Delta RL$).

2. A phase lock loop as claimed in claim 1, wherein said pulse length detector circuit determines whether to round the measured length of a pulse in said data signal to a next higher or a next lower integral number of periods of said oscillator signal.

3. A phase lock loop as claimed in claim 2, wherein said frequency capture circuit further comprises means for inhibiting the length deviation signal ($\Delta RL$) when it has derived by said pulse length detector circuit from a data pulse having a rounded length which deviates from a predetermined rounded length value.

4. A phase lock loop as claimed in claim 1, wherein said pulse length detector circuit selects for length measurement those pulses in said data signal which are shortest in respect of the number of consecutive basic length units included therein.

5. A phase lock loop as claimed in claim 4, wherein said frequency capture circuit further comprises a frequency deviation detector circuit for generating at the output of said frequency capture circuit a frequency control signal for said local oscillator, said frequency control signal having a first value when the shortest detected pulse length is below a predetermined minimum length and having a second value when the shortest detected pulse length exceeds said predetermined minimum length.

6. A phase lock loop as claimed in claim 1, wherein said pulse length detector circuit selects for length measurement those pulses in said data signal which are longest in respect of the number of consecutive basic length units included therein.

7. A phase lock loop as claimed in claim 6, wherein said frequency capture circuit further comprises a frequency deviation detector circuit for generating at the output of said frequency capture circuit a frequency control signal for said local oscillator, said frequency control signal having a first value when the longest detected pulse length is above a predetermined maximum length and having a second value when the longest detected pulse length is below said predetermined maximum length.

8. A phase lock loop as claimed in claim 1, wherein the frequency capture circuit further comprises a frequency lock detector for detecting whether characteristic pulse sequences in the data signal recur at predetermined periodic distances with respect to periods of the oscillator signal.

9. A phase lock loop as claimed in claim 8, wherein said frequency lock detector deactivates the frequency deviation signals produced by the frequency capture circuit when said characteristic pulse sequences recur at said predetermined periodic distances.

10. A phase lock loop as claimed in claim 8, wherein said frequency capture circuit further comprises:
   a pulse length decoder circuit having an input coupled to said pulse length detector circuit to receive said pulse length signal (RL) therefrom; and
   a frequency deviation detector circuit having inputs coupled to outputs of said pulse length decoder circuit, said frequency deviation detector circuit having an output from which it supplies frequency control signals at the output of said frequency capture circuit;
   said frequency lock detector producing at a control output thereof a control signal which is in a first state when the measured distance between said characteristic pulse sequences falls outside a predetermined window and which is in a second state when said measured distance falls inside said window, said control output controlling switching means coupled to said pulse length decoder circuit and to said frequency deviation detector circuit for selecting between the outputs of said circuits depending on whether the control signal produced by said frequency lock detector is in the first or the second state thereof.

11. The phase locked loop according to claim 4, wherein said phase lock loop is integrated into an integrated circuit.

* * * * *